(12) United States Patent (10) Patent No.: US 8,822,108 B2
Rolfson (45) Date of Patent: *Sep. 2, 2014

(54) RETICLES WITH SUBDIVIDED BLOCKING REGIONS

(71) Applicant: Micron Technology, Inc., Boise, ID (US)

(72) Inventor: J. Brett Rolfson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/763,092

(22) Filed: Feb. 8, 2013

(65) Prior Publication Data

US 2013/0157179 A1 Jun. 20, 2013

Related U.S. Application Data

(60) Division of application No. 13/305,987, filed on Nov. 29, 2011, now Pat. No. 8,383,301, which is a continuation of application No. 12/265,518, filed on Nov. 5, 2008, now Pat. No. 8,071,262.

(51) Int. Cl.
*G03F 1/00* (2012.01)

(52) U.S. Cl.
USPC .................................................. 430/5

(58) Field of Classification Search
USPC .................................................. 430/5
See application file for complete search history.

(56) References Cited

U.S. PATENT DOCUMENTS

| | | | |
|---|---|---|---|
| 5,194,345 A | 3/1993 | Rolfson | |
| 5,281,500 A | 1/1994 | Cathey et al. | |
| 5,989,754 A | 11/1999 | Chen et al. | |
| 6,238,824 B1 | 5/2001 | Futrell et al. | |
| 6,376,131 B1* | 4/2002 | Cho et al. | 430/5 |
| 6,421,113 B1 | 7/2002 | Armentrout | |
| 6,447,962 B2 | 9/2002 | Yang | |
| 6,569,576 B1 | 5/2003 | Hsueh et al. | |
| 6,569,584 B1 | 5/2003 | Ho et al. | |

(Continued)

FOREIGN PATENT DOCUMENTS

| | | |
|---|---|---|
| CN | 1438542 A | 8/2003 |
| KR | 20030059477 | 7/2003 |
| WO | 0175943 A2 | 10/2001 |

OTHER PUBLICATIONS

Bhattacharyya et al., Investigation of Reticle Defect Formation at DUV Lithography, IEEE/SEMI Advanced Manufacturing Conference, 2003. pp. 29-35.

(Continued)

*Primary Examiner* — Stewart Fraser
(74) *Attorney, Agent, or Firm* — TraskBritt

(57) ABSTRACT

Methods for designing, fabricating, and using attenuated phase shift reticles, or photomasks are disclosed. Methods are also disclosed for subdividing the radiation blocking regions of previously fabricated reticles of previously existing designs. The methods may include forming radiation blocking regions that are subdivided, by cut lines, into discrete, spaced apart sections with dimensions (e.g., surface area, etc.) configured to minimize or eliminate the buildup of electrostatic energy by the radiation blocking regions and/or the discharge of electrostatic energy from the radiation blocking regions and the damage that may be caused by such electrostatic discharge. The methods may include configuring the reticle to prevent radiation from passing through the cut lines between adjacent sections of a subdivided radiation blocking region.

14 Claims, 3 Drawing Sheets

(56) References Cited

U.S. PATENT DOCUMENTS

| | | |
|---|---|---|
| 6,893,780 B1 | 5/2005 | Galan et al. |
| 7,226,708 B2 | 6/2007 | Rolfson |
| 7,232,629 B2 | 6/2007 | Tu et al. |
| 7,419,748 B1 * | 9/2008 | Ahn .................................. 430/5 |
| 8,071,262 B2 * | 12/2011 | Rolfson ........................... 430/5 |
| 2002/0009653 A1 | 1/2002 | Kawada et al. |
| 2002/0179852 A1 | 12/2002 | Zheng et al. |
| 2003/0013258 A1 | 1/2003 | Lee |
| 2004/0135986 A1 | 7/2004 | Lee et al. |
| 2005/0278046 A1 | 12/2005 | Suttile et al. |
| 2006/0122724 A1 | 6/2006 | Croke et al. |
| 2006/0154153 A1 * | 7/2006 | Chiang et al. ..................... 430/5 |
| 2006/0216614 A1 | 9/2006 | Guo et al. |
| 2006/0234137 A1 | 10/2006 | Kim |
| 2007/0218667 A1 | 9/2007 | Rider |
| 2007/0258061 A1 | 11/2007 | Puerto et al. |
| 2007/0266364 A1 | 11/2007 | Pack et al. |
| 2009/0170011 A1 * | 7/2009 | Ahn et al. ......................... 430/5 |
| 2012/0070768 A1 | 3/2012 | Rolfson |

OTHER PUBLICATIONS

Levit et al., Investigating Static-Charge Issues in Photolithography Areas, Facilities Technologies, Jun. 2000.

Prevenslik, EFM and ESD in Photolithography by Cavity QED, IEEE, 2005, pp. 1103-1107.

Steinman, Best Practices for Applying Air Ionization, Electrical Overstress/Electrostatic Discharge Symposium Proceedings, Sep. 12, 1995, pp. 245-252.

Wiley et al., Investigating a New Generation of ESD-Induced Reticle Defects, Ultrapure Materials—Reticles, Apr. 1999, 5 pages.

* cited by examiner

US 8,822,108 B2

RETICLES WITH SUBDIVIDED BLOCKING REGIONS

CROSS-REFERENCE TO RELATED APPLICATIONS

This application is a divisional of U.S. patent application Ser. No. 13/305,987, filed Nov. 29, 2011, now U.S. Pat. No. 8,183,301 issued Feb. 26. 2013, which is a continuation of U.S. patent application Ser. No. 12/265,518, filed Nov. 5, 2008, now U.S. Pat. No. 8,071,262, issued Dec. 6, 2011, the disclosure of each of which is hereby incorporated herein by this reference in its entirety.

TECHNICAL FIELD

The present invention relates generally to reticles, which are also referred to in the art as "photomasks" and, more specifically, to reticles with light blocking layers that are configured to minimize the buildup and/or discharge of electrostatic energy. Specifically, embodiments of the present invention relate to reticles that include light blocking layers that are split into discrete, spaced apart sections, each having an area that minimizes the buildup and/or discharge of electrostatic energy.

BACKGROUND

Reticles are masks that are used to control the portions of a material (e.g., an unexposed, undeveloped photoresist) that may be exposed to electromagnetic radiation (e.g., light). In semiconductor device fabrication processes, most of the extremely small features are defined in part by use of reticles, with a large number of different reticles corresponding to different fabrication levels, or elevations, of the semiconductor device.

The reticles that are used in semiconductor device fabrication processes typically include a quartz substrate upon which a radiation blocking layer is fabricated. The light blocking layer includes an opaque, or non-transmissive, material, such as chromium. Attenuated phase shifting reticles may also include one or more layers of partially transmissive, phase shifting materials, such as molybdenum silicide ("MoSi") or chromium oxide ("CrO"), that phase shift radiation transmitted therethrough (e.g., by 180°). By phase shifting the radiation, diffraction of the radiation may be reduced, improving the resolution of the reticle.

When the reticle is used, radiation is directed through the reticle onto a layer of unexposed, undeveloped photoresist that has been applied to a substrate, such as a semiconductor wafer, which transfers the pattern defined by the light blocking layer and any partially transmissive regions to the layer of unexposed, undeveloped photoresist. The areas of the layer of photoresist that are exposed to radiation passing through the transparent areas and partially transmissive areas of the reticle are typically smaller than the corresponding transparent areas of the reticle. In some cases, the exposed areas of the photoresist have lateral dimensions that are one-fourth the sizes of their corresponding lateral dimensions of the transparent areas of the reticle.

Despite the seemingly increased tolerance that these differences in dimensions may impart to a reticle during its fabrication and use, when a reticle is used in semiconductor device fabrication processes, even very slight damage to the reticle and the presence of very small contaminant particles on transparent and partially transmissive attenuation regions of the reticle may cause imperfections in a photoresist. These imperfections are, of course, transferred to a semiconductor device during its fabrication, and may affect the performance and reliability of the semiconductor device and, ultimately, reduce semiconductor device yields.

One of the prevalent causes of the attraction of contaminants to reticles is the collection of electrostatic energy. The discharge of collected electrostatic energy, or "electrostatic discharge" or "ESD," is also known to cause damage to the light blocking layers of reticles. ESD is particularly prevalent at the typically tapered corners 27 of attenuation regions 26, as shown in FIG. 1. Although a number of measures have been developed in an attempt to reduce the amount of electrostatic energy to which reticles may be exposed, they are still exposed to some electrostatic energy, which, over time, is collected by reticle features (e.g., metallic light blocking layers).

DETAILED DESCRIPTION

Figure 1:
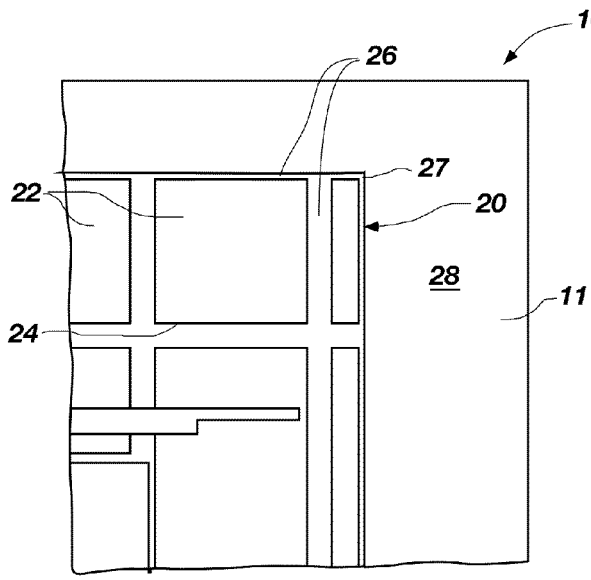
FIG. 1 is a schematic representation of a portion of an embodiment of a reticle according to the present invention.

The present invention, according to various embodiments, such as that shown in FIG. 1, includes a reticle 10, or "photomask," with a transparent substrate 11 (e.g., quartz), attenuation regions 26 (e.g., MoSi, CrO) that are configured to allow some radiation to pass therethrough and to phase-shift the radiation that passes therethrough, and blocking regions 20 that comprise opaque material (e.g., chrome), which prevents the transmission of radiation. Blocking regions 20 that include a plurality of discrete sections 22 that are spaced apart from one another by way of cut lines 24. The area of each section 22, as well as the distance across each cut line 24, or the distance that adjacent sections 22 are spaced apart from one another, minimizes or eliminates at least one of the buildup of electrostatic energy or the discharge of electrostatic energy (i.e., electrostatic discharge, or "ESD"). In one embodiment, each section 22 of each blocking region 20 has a maximum area of about 25 $\mu m^2$. In another embodiment, each section of each blocking region 20 has a maximum area of about 400 $\mu m^2$. While the distance across each cut line 24 and, thus, between adjacent sections 22 may be less than the resolution of reticle 10, or a "sub-resolution" distance, in some embodiments of reticle 10, the distance across each cut line 24, or the spacing between adjacent sections 22, may be as great as about 0.5 $\mu m$.

Cut lines 24 may, in some embodiments, be defined along a grid with fixed lateral (i.e., x and y) distances between adjacent cut lines 24. In embodiments where cut lines 24 are evenly spaced, the areas of sections 22 of each blocking region 20 may differ from one another, with no section 22 having an area that exceeds a predetermined maximum (e.g., 25 µm$^2$, 100 µm$^2$, 400 µm$^2$, 625 µm$^2$, 900 µm$^2$, another area that exceeds 625 µm$^2$, etc.). In other embodiments, cut lines 24 may be laid out in a manner that provides each section 22 of each blocking region 20 with substantially the same (e.g., predetermined) surface area as one or more other sections 22 of blocking region 20.

In some embodiments, material of attenuation regions 26 may be located beneath or within cut lines 24 to prevent undesired diffusion of radiation through cut lines 24.

The fabrication of reticle 10 may, in various embodiments, include the formation and patterning of one or more material layers on a substrate 11 that comprises a material (e.g., quartz, etc.) that is substantially transparent to the wavelengths of radiation that will be used with reticle 10. One embodiment of such a process, in which an attenuated phase shifting mask is formed, is illustrated by FIGS. 2 through 5.

Figure 2:
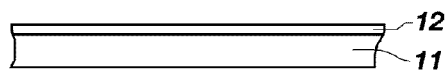
FIGS. 2 through 5 depict an embodiment of a process for fabricating the embodiment of reticle shown in FIG. 1.

In the illustrated embodiment, at least one layer 12 that comprises a radiation attenuating material, which blocks a known percentage of radiation of a particular wavelength or wavelength range while permitting a remainder of the radiation to pass therethrough, is disposed on substrate 11, as shown in FIG. 2. The technique by which first layer 12 is disposed on substrate 11 depends at least in part upon the material from which first layer 12 is to be formed. In some embodiments, layer 12 may comprise molybdenum silicide ("MoSi"), tantalum silicon oxynitride (TaSiON), or molybdenum silicon oxynitride (MoSiON), which may be formed by physical vapor deposition (PVD) processes.

Figure 3:
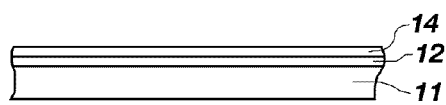

Thereafter, as shown in FIG. 3, another layer 14 may be formed over layer 12 and substrate 11. In some embodiments, a thickness of layer 14 may be about 400 Å to about 800 Å. Layer 14 may include one or more sublayers, at least one of which includes a radiation blocking, or opaque, material. In some embodiments, the radiation blocking material may comprise chromium (Cr), although other known materials may also be used. In embodiments where layer 14 includes a plurality of sublayers, one of the sublayers may be formed from a material and to a thickness that is substantially opaque to the wavelengths of radiation with which reticle 10 is to be used, while one or more other sublayers are formed from materials that will attenuate and/or phase shift the wavelengths of radiation with which reticle 10 is to be used (with varying degrees of attenuation if the final structure is to include more than one layer of radiation attenuating material). The technique by which layer 14 or each sublayer thereof is formed is appropriate for the material of that layer or sublayer. With the formation of layer 14, all of the layers of a "tritone" mask, including transparent material, attenuating material, and opaque material, are present.

In some embodiments, blocking regions 20 (FIG. 5) (i.e., a desired wafer pattern) may be defined from layers 14 and 12 in a first "write," then blocking regions 20 (at least layer 14 thereof) may be subdivided (i.e., cut lines 24 (FIG. 5) may be formed) in a second "write." In other embodiments, cut lines 24 may be formed in layer 14 as blocking regions 20 are defined.

Figure 4:
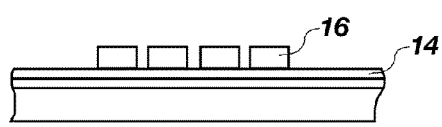

In each "writing" process, a photoresist 16 may be patterned over layer 14 in the manner depicted in FIG. 4. To form photoresist 16, unexposed photoresist may be applied to layer 14 by known techniques, such as by spin-on processes. The unexposed photoresist may then be selectively exposed, developed, and rinsed by known processes.

Figure 5:
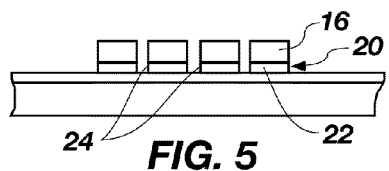

As illustrated by FIG. 5, material may be removed from regions of layer 14 (FIG. 4) (or an uppermost sublayer thereof) that are exposed through photoresist 16 by use of suitable techniques (e.g., wet etch processes, dry etch processes, etc.) to define at least a portion of each blocking region 20 of reticle 10, as well as cut lines 24 between discrete, spaced apart sections 22 of each blocking region 20.

Material may also be removed from underlying layers (e.g., lower sublayers of layer 14 or an underlying layer 12). Known techniques may be effected through the same photoresist 16, through remaining portions of a previously etched layer, with another, subsequently formed photoresist, or with any combination of the foregoing, to remove material from underlying layers.

In other embodiments, layer 12, 14 or sublayers thereof may be formed, then patterned, in sequence. Stated another way, each layer or sublayer may be formed, a photoresist 16 may be formed thereover, and that layer or sublayer may be etched before another layer or sublayer is formed thereover.

Regardless of the order in which processes are effected, the result is the definition of transparent regions 28, attenuation regions 26, and opaque blocking regions 20 of reticle 10, as shown in FIG. 1.

The present invention also includes embodiments of methods for forming cut lines 24 in and defining discrete sections 22 from blocking regions 20 of existing (i.e., previously fabricated) reticles. A specific embodiment of such a process includes patterning a photoresist 16' on an existing reticle 10', as shown in FIG. 6, and using photoresist 16' to define cut lines 24 in blocking regions 20 of reticle 10', as illustrated by FIG. 7.

Figure 6:
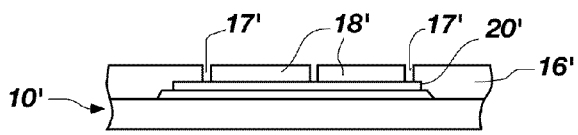
FIGS. 6 and 7 depict an embodiment of a process for modifying a previously fabricated reticle of a previously existing design.

With reference to FIG. 6, photoresist 16' may be formed by applying an unexposed photoresist material to reticle 10', exposing the unexposed photoresist material to activating radiation, then developing the exposed photoresist material to fully cure the same. The resulting structure includes apertures 17' that expose portions of undivided blocking regions 20' within which cut lines 24 (FIG. 7) are to be formed. Solid regions 18' of photoresist 16' cover all of the remaining areas of undivided blocking regions 20', protecting the covered areas of undivided blocking regions 20' from the etchants that will be used to define cut lines 24 in undivided blocking regions 20'.

Figure 7:
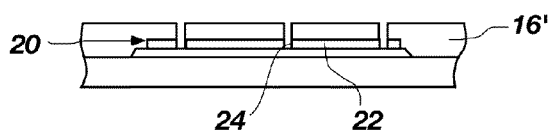

FIG. 7 illustrates the removal of material from the exposed portions of undivided blocking regions 20' (FIG. 6) through photoresist 16' to define cut lines 24 in and subdivide blocking regions 20' into discrete, spaced apart sections 22. Known material removal processes, including, without limitation, wet etch processes and dry etch processes employing etchants that will remove the material or materials of undivided blocking regions 20', may be used to define cut lines 24 in undivided blocking regions 20' and to divide at least some blocking regions 20' into a plurality of discrete, spaced apart sections 22. Once subdivided blocking regions 20 have been formed, resist 16' may be removed and the modified reticle 10' may be processed (e.g., cleaned, inspected, repaired if necessary, etc.) for use.

The inclusion of cut lines 24 in blocking regions 20 of a reticle 10 according to embodiments of the present invention may reduce or eliminate electrostatic energy that may be built up in, and discharged from, the metal (e.g., chromium) of blocking regions 20.

Figure 8:
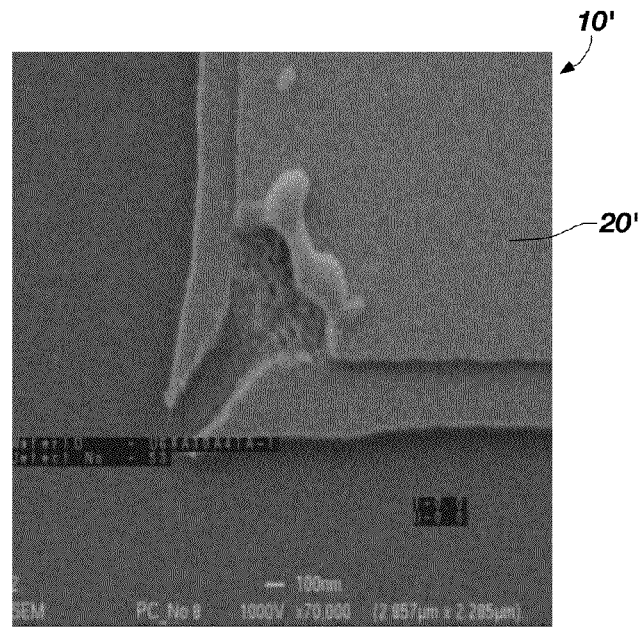
FIG. 8 is a scanning electron micrograph (SEM) of a reticle having a previously existing design that has suffered damage from ESD.

FIG. 8 is a scanning electron micrograph (SEM) obtained using a scanning electron microscope available from JEOL Ltd. of Tokyo, Japan. The SEM of FIG. 8 shows a portion of a fully fabricated reticle 10' according to a previously existing design, with an undivided blocking region 20' that has been damaged by ESD. The ESD and the damage occurred after undivided blocking region 20' of reticle 10' was repaired and a 25 mm² area surrounding the repaired location was subjected to a stream of carbon dioxide ($CO_2$) from four directions using a SCS-1100 reticle cleaning apparatus from Eco-Snow Systems of Livermore, Calif. The damage that is shown in FIG. 8 surrounds the location of undivided blocking region 20' that was repaired, and is theorized to have been caused as the high velocity stream of $CO_2$ from the SCS-1100 reticle cleaning apparatus caused electrostatic energy stored within undivided blocking region 20' to discharge from undivided blocking region 20' during a post-fabrication inspection, repair, and clean of reticle 10'.

Figure 9:
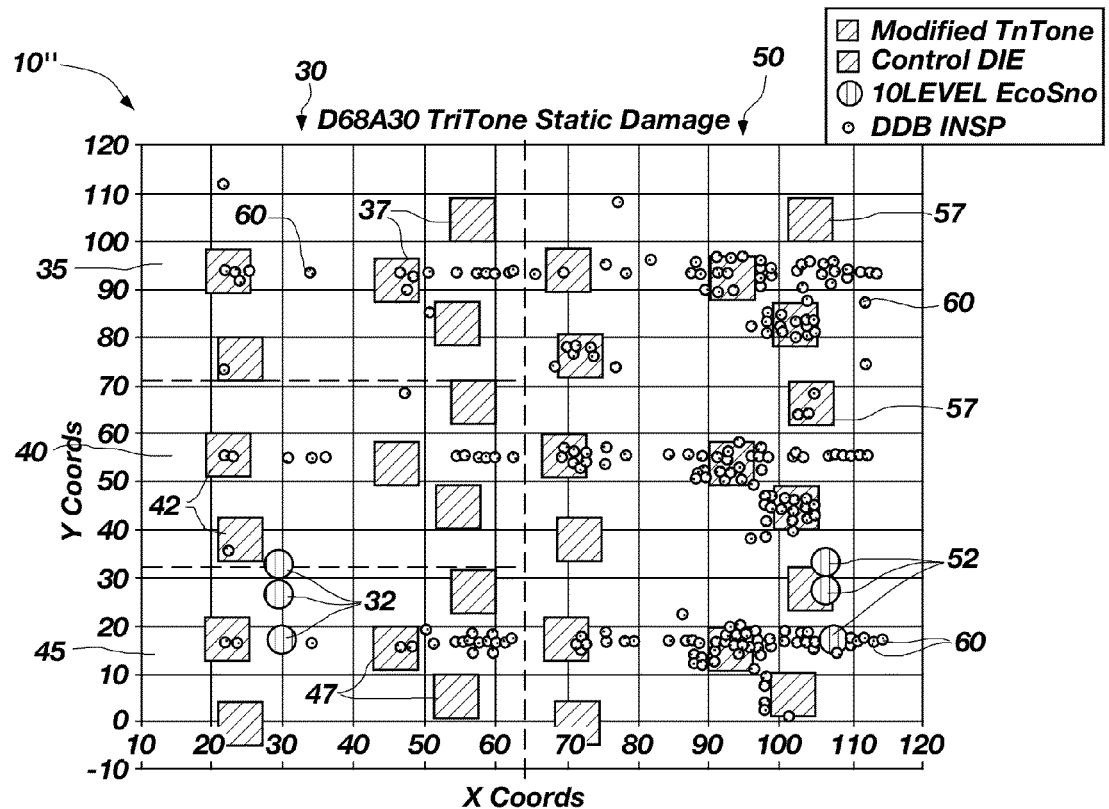
FIG. 9 is a graph depicting a test reticle and the results that were obtained through testing and evaluation of the test reticle for ESD-induced damage.
Figure 10:
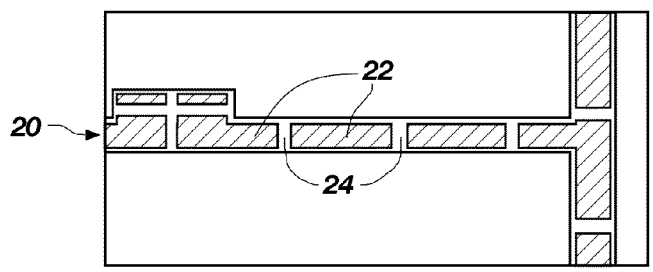
FIGS. 10 through 12 illustrate portions of various test regions of the test reticle of FIG. 9.
Figure 11:
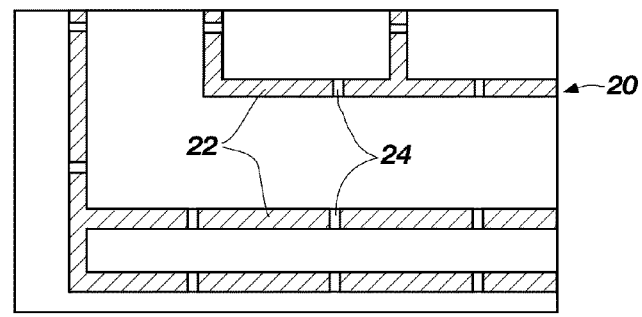
Figure 12:
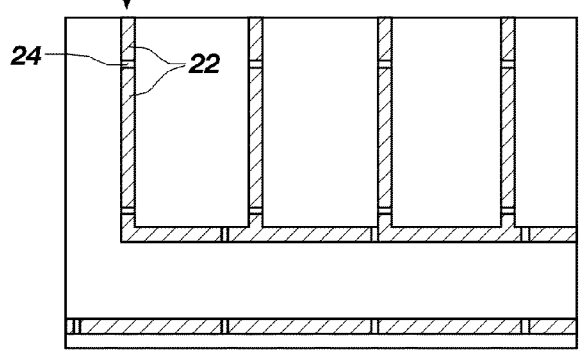
Figure 13:
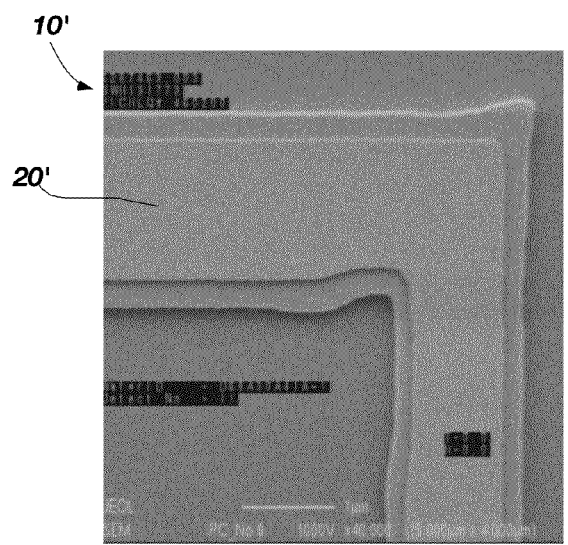
FIG. 13 illustrates a portion of a control region of the test reticle of FIG. 9.

This theory was tested by fabricating a test reticle 10" of the same type as that shown in FIG. 8, with an experimental half 30 (the left half) and a control half 50 (the right half). Test reticle 10" is depicted by FIG. 9 in the form of a graph. Experimental half 30 included three experimental areas 35, 40, and 45. In the uppermost (as the drawing sheet is oriented) experimental area 35, blocking regions 20 of test reticle 10" were divided into discrete, spaced apart sections 22 (FIG. 1) by way of 0.5 µm wide cut lines 24 (FIG. 1) that were organized in a grid and spaced apart 15 µm apart from one another (i.e., cut lines 24 were organized as a 15 µm×15 µm square grid) (see also FIG. 10). Blocking regions 20 of a center experimental area 40 were divided into discrete, spaced apart sections 22 by way of 0.5 µm wide cut lines 24 that had been organized as a 10 µm×10 µm square grid (i.e., vertically extending cut lines 24 were spaced 10 µm apart from each other, and horizontally extending cut lines 24 were spaced 10 µm apart from each other (see FIG. 11). A lowermost experimental area 45 of experimental half 30 of test reticle 10" included 0.5 µm wide cut lines 24 that were organized as a 5 µm×5 µm square grid to divide blocking regions 20 within experimental area 45 into discrete, spaced apart sections 22 having maximum surface areas of 25 µm² (see FIG. 12). While the distances between the cut lines 24 appear to be about the same in each of FIGS. 10 through 12, it is notable that the blocking regions 20 over which they are formed have the same widths, which appear to be decreasingly smaller from FIG. 10 through FIG. 12. Blocking regions 20' of control half 50 remained undivided, as depicted in FIG. 13.

As reticle inspection processes are typically effected at numerous points throughout reticle fabrication processes, three test locations 32 on experimental half 30 of reticle 10" and three corresponding test locations 52 on control half 50 of test reticle 10" were subjected to a high velocity stream of $CO_2$ from the SCS-1100 reticle cleaning apparatus during an intermediate point in the process of fabricating test reticle 10". The high velocity stream of $CO_2$ was directed toward each preselected test location 32, 52 from four different directions, which were oriented at 90° intervals around each preselected test location 32, 52, onto a 5 mm² area centered about that preselected test location 32, 52.

Upon inspecting test reticle 10" with defect inspection equipment available from KLA-Tencor Corporation of San Jose, Calif., some ESD-induced damage was detected, albeit significantly less than the damage illustrated in FIG. 8, which occurred after reticle 10' had been completely fabricated, repaired, and cleaned.

Once fabrication of test reticle 10" was complete, the SCS-1100 reticle cleaning apparatus was again used, this time to direct a high velocity stream of $CO_2$ toward five different preselected test locations 37, 42, 47 in each area 35, 40, 45, respectively, of experimental half 30 of reticle 10" and toward fifteen different preselected test locations 57 across control half 50 of reticle 10". Again, the high velocity stream of $CO_2$ was directed toward each preselected test locations 37, 42, 47, 57 from four different directions, which were oriented at 90° intervals around each preselected test location 37, 42, 47, 57, onto a 5 mm² area centered about that preselected test location 37, 42, 47, 57.

Thereafter, a 125 nm resolution inspection of test reticle 10" was conducted using the KLA-Tencor defect inspection equipment. In that inspection, the features of the test reticle 10" that were visualized by the defect inspection equipment were compared with the intended features of test reticle 10" (i.e., the data that were used to control fabrication of test reticle 10") to identify the locations of all of the defects and irregularities of test reticle 10". Each location in which a defect was identified, or "defect location," was then visually inspected using a JEOL scanning electron microscope. Visual inspection of test reticle 10" was conducted blindly, i.e., without informing the inspectors of any of the preselected test locations 32, 52, 37, 42, 47, 57 or of the locations where blocking regions 20 (FIG. 1) had been subdivided into discrete, spaced apart sections 22.

The results of the evaluation of test reticle 10" are set forth in the graph of FIG. 9. Notably, there are several times more defect locations 60 on control half 50 of test reticle 10" than appear on experimental half 30 of test reticle 10". Most of the defects on control half 50 were concentrated at or near preselected locations 57 on control half 50, while there was no distinctive concentration of defect locations 60 at any preselected location 37, 42, 47 on experimental half 30. Visual inspection of the SEMs of defect locations 60 on control half 50 revealed that many of the defects located by the defect inspection equipment were damage caused by ESD, while visual inspection of defect locations 60 on experimental half 30 showed no ESD-induced damage.

Further analysis was conducted to verify the absence of ESD-induced damage to preselected test locations 37, 42, and 47 on experimental half 30 of test reticle 10". Again using the scanning electron microscope, a second visual inspection was conducted on each defect location 60 on experimental half 30. Subsequent inspections for ESD-induced damage and other anomalies of unknown causes identified no such defects or damage. With the assistance of the scanning electron microscope at a higher magnification (i.e., 10,000× and 70,000×), a third visual inspection of these same defect locations was conducted. The third visual inspection confirmed the absence of ESD-induced damage on experimental half 30 of test reticle 10".

Visual inspection of test reticle 10" further confirmed that the horizontal bands of defect locations 60 that extend across experimental half 30 were from the rounding of the corners of blocking regions 20 or underlying attenuation regions 26, which occurred as material layers were etched to form blocking regions 20 and/or attenuation regions 26.

These results indicate that the subdivision of blocking regions 20 of a reticle 10 reduces or eliminates the likelihood that electrostatic energy will be discharged from blocking regions 20, as well as the likelihood of damage that would have otherwise been caused by such ESD. It is also believed that the subdivision of blocking regions 20 minimizes or eliminates the storage of electrostatic energy by blocking regions 20.

Use of a reticle 10 according to embodiments of the present invention may avoid a number of problems associated when undivided blocking regions 20' of existing reticles 10' become charged with electrostatic energy. Such uses may be effected alone or in combination with other static suppression techniques or features. One embodiment of use of a reticle 10 according to the present invention includes the reduction or elimination of damage that may be caused by the buildup or discharge of electrostatic energy. The likelihood and magnitude of ESD damage caused during post-repair cleaning may be reduced or eliminated.

In another embodiment, use of a reticle 10 of the present invention may reduce or eliminate the electrostatic attraction and adhesion of contaminants to reticle 10, along with the incidence of semiconductor device defects attributable to such contamination. As such, use of a reticle 10 according to an embodiment of the present invention in semiconductor device fabrication processes will result in semiconductor devices of increased reliability and increase semiconductor device yields.

Although the foregoing description contains many specifics, these should not be construed as limiting the scope of the present invention, but merely as providing illustrations of some embodiments. Similarly, other embodiments of the invention may be devised which lie within the scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein which fall within the meaning and scope of the claims are to be embraced thereby.

What is claimed:

1. A reticle, comprising:
   a radiation blocking material over a surface of a transparent substrate, the radiation blocking material including discrete sections, each discrete section having a surface area designed to minimize at least one of electrostatic buildup on and electrostatic discharge from the radiation blocking material, adjacent discrete sections of the radiation blocking material separated from one another by a subresolution distance; and
   tantalum silicon oxynitride between the discrete sections of the radiation blocking material.

2. The reticle of claim 1, wherein the discrete sections are arranged in a grid array.

3. The reticle of claim 1, wherein each discrete section has a maximum surface area of about 900 $\mu m^2$.

4. The reticle of claim 1, wherein each discrete section has a maximum surface area of about 400 $\mu m^2$.

5. The reticle of claim 1, wherein the adjacent discrete sections of the radiation blocking material are separated from one another a distance sufficient to inhibit electromagnetic radiation from being transmitted between the adjacent discrete sections.

6. The reticle of claim 1, wherein the discrete sections have the same surface area.

7. The reticle of claim 1, wherein the discrete sections have different surface areas.

8. A reticle comprising: a radiation blocking material over attenuation material and a surface of a transparent substrate, the attenuation material including an upper layer and a lower layer, the radiation blocking material and the upper layer of the attenuating material comprising discrete sections, adjacent discrete sections of the radiation blocking material and the upper layer of the attenuation material separated by a space of subresolution width.

9. The reticle of claim 8, wherein each discrete section is of a surface area selected to minimize at least one of buildup of electrostatic energy and discharge of electrostatic energy.

10. The reticle of claim 8, wherein the lower layer of the attenuation material is within the space.

11. The reticle of claim 8, wherein the radiation blocking material comprises chromium.

12. The reticle of claim 8, wherein the radiation blocking material comprises a plurality of sublayers.

13. The reticle of claim 12, wherein one sublayer of the plurality of sublayers comprises a substantially opaque material.

14. The reticle of claim 12, wherein at least one sublayer of the plurality of sublayers comprises a phase-shift material.

\* \* \* \* \*

UNITED STATES PATENT AND TRADEMARK OFFICE
CERTIFICATE OF CORRECTION

PATENT NO. : 8,822,108 B2
APPLICATION NO. : 13/763092
DATED : September 2, 2014
INVENTOR(S) : J. Brett Rolfson Page 1 of 1

It is certified that error appears in the above-identified patent and that said Letters Patent is hereby corrected as shown below:

In the Specification

In column 1, line 9, delete "8,183,301" and insert -- 8,383,301, --, therefor.

In the Claims

In column 8, line 15, in Claim 8, delete "reticle" and insert -- reticle, --, therefor.

In column 8, line 19, in Claim 8, delete "attenuating" and insert -- attenuation --, therefor.

Signed and Sealed this
Eighteenth Day of November, 2014

Michelle K. Lee
*Deputy Director of the United States Patent and Trademark Office*